US006959055B2

(12) United States Patent
Litwin, Jr. et al.

(10) Patent No.: US 6,959,055 B2
(45) Date of Patent: Oct. 25, 2005

(54) MULTI-STAGE AUTOMATIC GAIN CONTROL FOR SPREAD-SPECTRUM RECEIVERS

(75) Inventors: Louis Robert Litwin, Jr., Plainsboro, NJ (US); Adam Robert Margetts, Plainsboro, NJ (US); Paul Gothard Knutson, Lawrenceville, NJ (US)

(73) Assignee: Thomson Licensing, Boulogne-Billancourt (FR)

( * ) Notice: Subject to any disclaimer, the term of this patent is extended or adjusted under 35 U.S.C. 154(b) by 263 days.

(21) Appl. No.: 10/206,690

(22) Filed: Jul. 26, 2002

(65) Prior Publication Data

US 2004/0017865 A1 Jan. 29, 2004

(51) Int. Cl.[7] ................................................ H04L 27/08
(52) U.S. Cl. ........................ 375/345; 375/136; 375/147
(58) Field of Search ................................ 375/344, 345, 375/136, 147; 700/37; 341/139; 330/279; 329/304

(56) References Cited

U.S. PATENT DOCUMENTS 5,422,601 A * 6/1995 Kovacs et al. .............. 330/279
5,838,269 A * 11/1998 Xie ............................ 341/139
5,917,865 A * 6/1999 Kopmeiners et al. ....... 375/345
6,160,443 A * 12/2000 Maalej et al. ............... 329/304
6,324,228 B1 11/2001 Millward et al. ........... 375/344
6,553,084 B1 * 4/2003 Maru ......................... 375/345
2002/0193958 A1 12/2002 Underbrink et al. ........ 702/107

* cited by examiner

*Primary Examiner*—Stephen Chin
*Assistant Examiner*—Curtis Odom
(74) *Attorney, Agent, or Firm*—Joseph S. Tripoli; Robert B. Levy; Joseph J. Kolodka

(57) ABSTRACT

An apparatus and method for automatic gain control in spread-spectrum communications includes an automatic gain control apparatus for a spread-spectrum receiver, including a received signal strength indicator, an analog amplifier in signal communication with the received signal strength indicator, an analog-to-digital converter in signal communication with the analog amplifier, a digital automatic gain control loop in signal communication with the analog-to-digital converter, and a digital-to-analog converter in signal communication with the digital automatic gain control loop for providing a signal indicative of a digital gain to the analog amplifier; where the corresponding method for automatic gain control in spread-spectrum communications includes receiving an analog signal, measuring the strength of the received analog signal, deriving a first analog gain in correspondence with the measured strength, applying the derived first analog gain to an analog amplifier, deriving a second analog gain from a pilot channel signal within an automatic gain control loop, deriving a digital gain from the pilot channel signal within the automatic gain control loop, and applying an automatic gain control signal indicative of the second analog gain and the digital gain to the analog amplifier.

29 Claims, 8 Drawing Sheets

MULTI-STAGE AUTOMATIC GAIN CONTROL FOR SPREAD-SPECTRUM RECEIVERS

BACKGROUND

The present disclosure relates to spread-spectrum communications and, in particular, to a method and apparatus for providing a multi-stage automatic gain control for spread-spectrum receivers.

In typical communications systems, a gain is used to adjust the power level of a received signal. The gain function of a communications receiver generates an error that is used to compute an amplifier gain. The gain operation is intended to bring the received signal to a known and constant power level.

Unfortunately, the channel conditions in a mobile environment change very rapidly, and the Signal-to-Noise Ratio ("SNR") levels in a spread-spectrum system, such as, for example, a Wideband Code Division Multiple Access ("WCDMA") system, are low. Typical systems implement a single gain loop according to a compromise based on anticipated operating conditions. Thus, a fast gain loop may be able to track sudden changes, but has the drawback that it is generally noisy. In contrast, a slow gain loop may be able to average out the noise, but has the drawback that it is generally not able to keep up with sudden channel changes. What is needed is a gain solution capable of tracking sudden changes while averaging out noise in a spread-spectrum system.

SUMMARY

These and other drawbacks and disadvantages of the prior art are addressed by an apparatus and method for providing a multi-stage automatic gain control for spread-spectrum receivers.

The apparatus for automatic gain control in spread-spectrum communications includes an automatic gain control apparatus for a spread-spectrum receiver having a received signal strength indicator, an analog amplifier in signal communication with the received signal strength indicator, an analog-to-digital converter in signal communication with the analog amplifier, a digital automatic gain control loop in signal communication with the analog-to-digital converter, and a digital-to-analog converter in signal communication with the digital automatic gain control loop for providing a signal indicative of a digital gain to the analog amplifier.

The corresponding method for automatic gain control in spread-spectrum communications includes receiving an analog signal, measuring the strength of the received analog signal, deriving a first analog gain in correspondence with the measured strength, applying the derived first analog gain to an analog amplifier, deriving a second analog gain from a pilot channel signal within an automatic gain control loop, deriving a digital gain from the pilot channel signal within the automatic gain control loop, and applying an automatic gain control signal indicative of the second analog gain and the digital gain to the analog amplifier.

These and other aspects, features and advantages of the present disclosure will become apparent from the following description of exemplary embodiments, which is to be read in connection with the accompanying drawings.

BRIEF DESCRIPTION OF THE DRAWINGS

The present disclosure teaches a method and apparatus for providing a multi-stage automatic gain control for spread-spectrum receivers in accordance with the following exemplary figures, in which.

DETAILED DESCRIPTION OF PREFERRED EMBODIMENTS

The present disclosure relates to spread-spectrum communications and, in particular, to a method and apparatus for providing a multi-stage automatic gain control for spread-spectrum receivers. Embodiments of the present disclosure include hand-held cellular devices usable in spread-spectrum communications systems.

The Automatic Gain Control ("AGC") function of a communications receiver generates an error that is used to compute a gain for one or more amplifiers. The AGC operation brings the received signal to a known and constant power level. The channel conditions in a mobile environment change very rapidly, and the Signal-to-Noise Ratio ("SNR") levels in a spread-spectrum system, such as, for example, a Wideband Code Division Multiple Access ("WCDMA") system, are low. Thus, a fast AGC loop is able to track sudden changes but is also noisy. In contrast, a slow AGC loop averages out the noise but is not able to keep up with sudden channel changes. In order to address both situations, the AGC strategy of the present disclosure comprises multi-stage control loops. These loops are based on signals available in spread-spectrum communications systems. Embodiments of the presently disclosed strategy are usable in any spread-spectrum system, including, for example, spread-spectrum systems meeting the requirements of the WCDMA standard.

Embodiments of the present disclosure use an analog amplifier for AGC gain adjustment. The errors used to derive the gain for this amplifier, which can be a single amplifier or several stages of amplifiers, are measured in several locations. The terms "analog" AGC or "digital" AGC refer to whether the associated gain adjustment occurs in the analog domain or in the digital domain.

Figure 1:
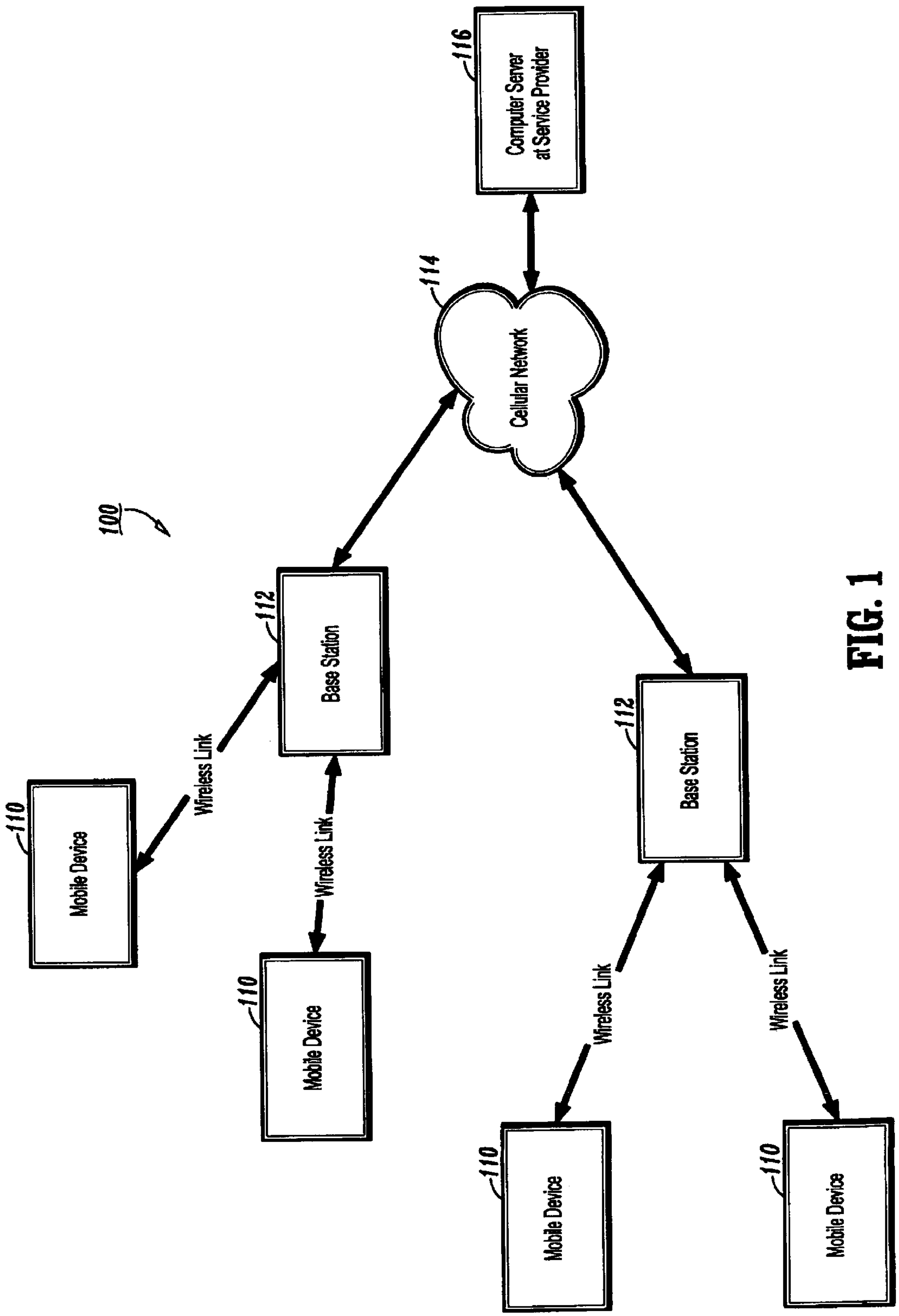
FIG. 1 shows a block diagram for a spread-spectrum communications system according to an illustrative embodiment of the present disclosure.

As shown in FIG. 1, a spread-spectrum communications system 100 includes spread-spectrum communications devices 110, such as, for example, mobile cellular telephone embodiments. The communications devices 110 are each connected in signal communication to a base station 112 via spread-spectrum wireless links. Each base station 112, in turn, is connected in signal communication with a cellular network 114. A computer server 116, such as, for example, a server residing with a cellular service provider, is connected in signal communication with the cellular network 114. Thus, a communications path is formed between each cellular communications device 110 and the computer server 116.

Figure 2:
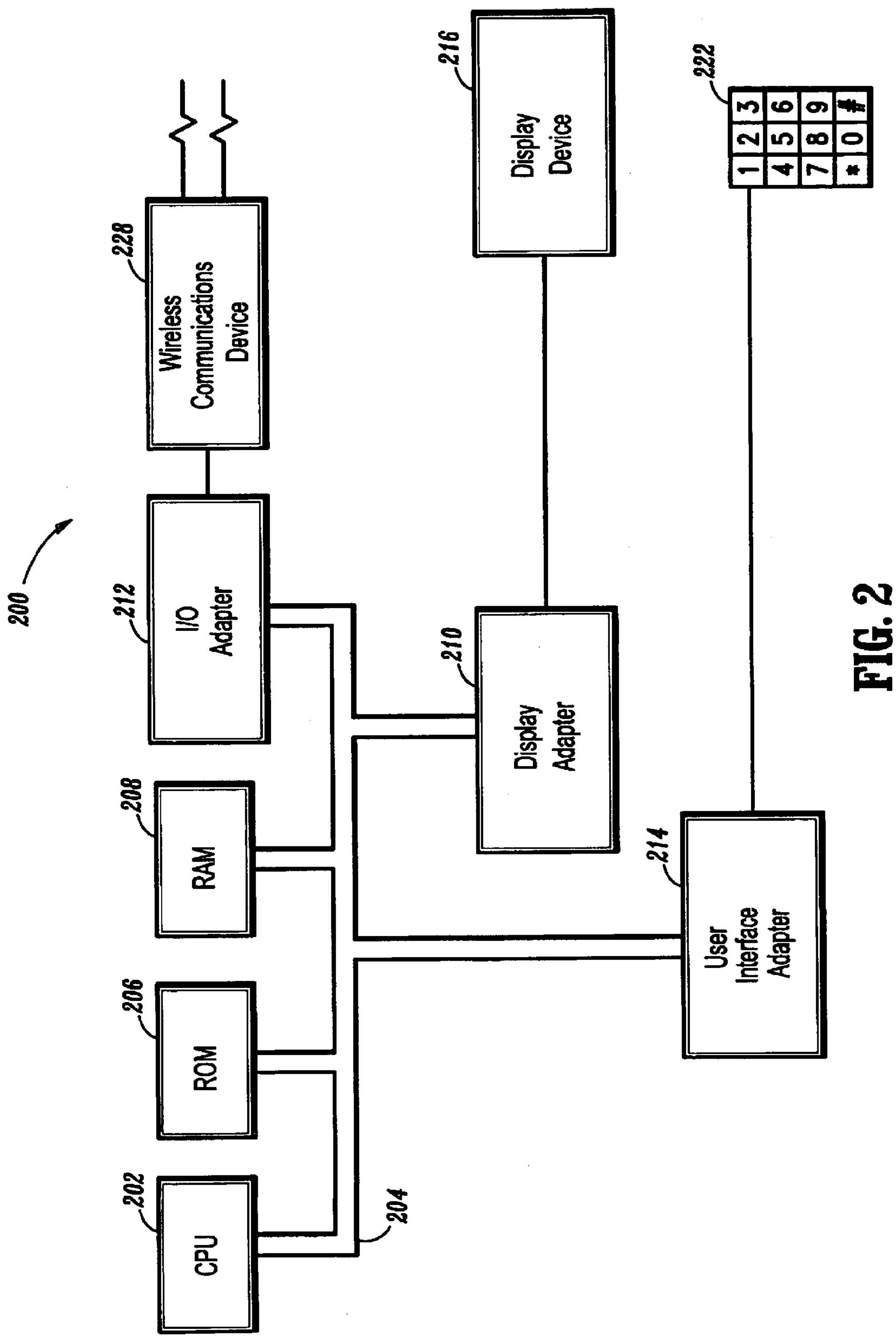
FIG. 2 shows a block diagram for a spread-spectrum hand-held communications apparatus usable in accordance with the system of FIG. 1.

Turning to FIG. 2, a spread-spectrum communications apparatus is generally indicated by the reference numeral 200. The communications apparatus 200 may be embodied, for example, in a mobile cellular telephone according to embodiments of the present disclosure. The communications apparatus 200 includes at least one processor or Central Processing Unit ("CPU") 202 in signal communication with a system bus 204. A Read Only Memory ("ROM") 206, a Random Access Memory ("RAM") 208, a display adapter 210, an Input/Output ("I/O") adapter 212, and a user interface adapter 214 are also in signal communication with the system bus 204.

A display unit 216 is in signal communication with the system bus 204 via the display adapter 210, and a keypad 222 is in signal communication with the system bus 204 via the user interface adapter 214. The apparatus 200 also includes a wireless communications device 228 in signal communication with the system bus 204 via the I/O adapter 212, or via other suitable means as understood by those skilled in the art.

As will be recognized by those of ordinary skill in the pertinent art based on the teachings herein, alternate embodiments of the communications apparatus 200 are possible. For example, alternate embodiments may store some or all of the data or program code in registers located on the processor 202.

Figure 3:
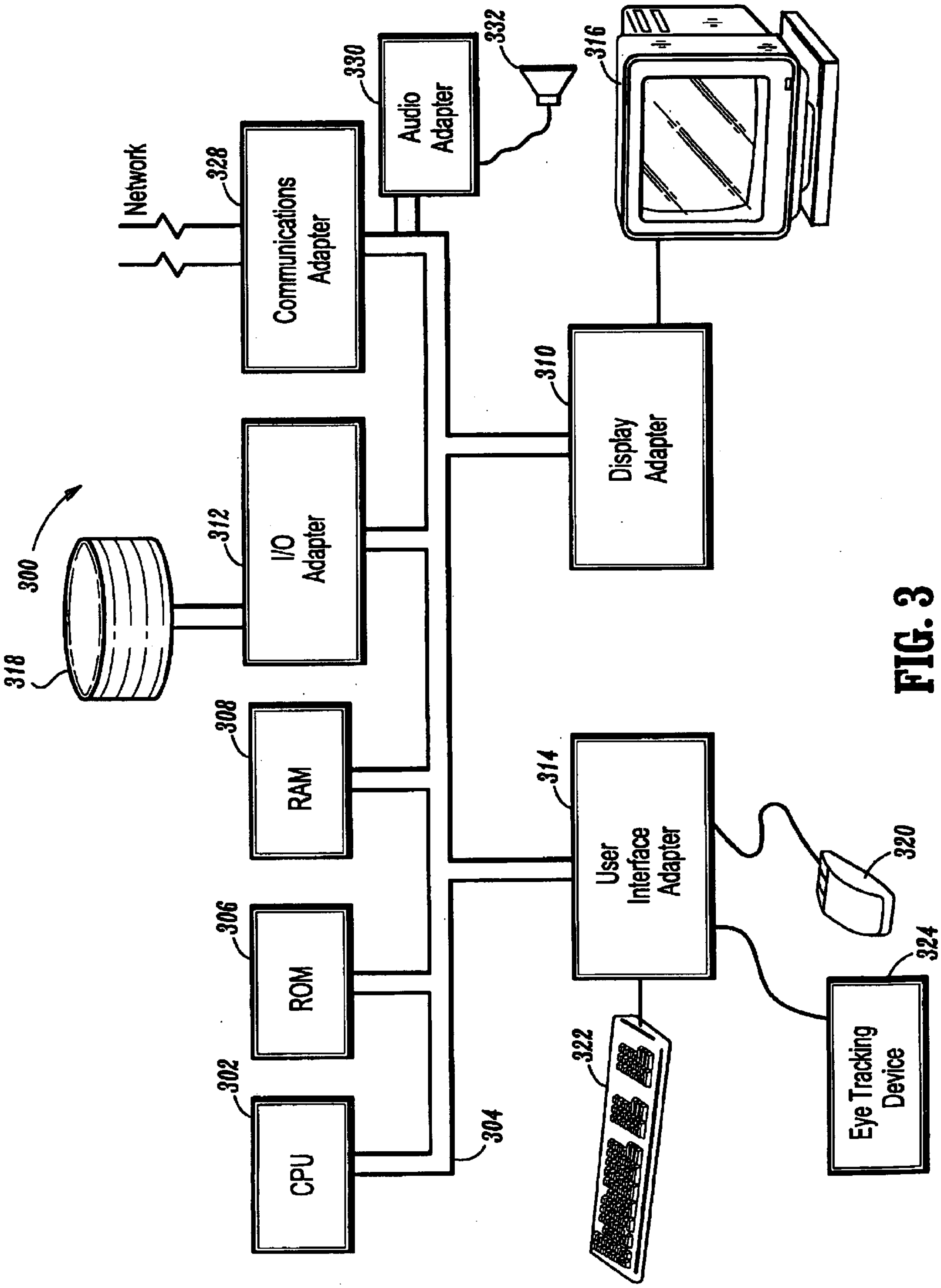
FIG. 3 shows a block diagram for a service provider computer server usable in accordance with the system of FIG. 1.

Turning now to FIG. 3, a service provider computer server is indicated generally by the reference numeral 300. The server 300 includes at least one processor or CPU 302 in signal communication with a system bus 304. A ROM 306, a RAM 308, a display adapter 310, an I/O adapter 312, and a user interface adapter 314 are also in signal communication with the system bus 304.

A display unit 316 is in signal communication with the system bus 304 via the display adapter 310. A data storage unit 318, such as, for example, a magnetic or optical disk storage unit or database, is in signal communication with the system bus 104 via the I/O adapter 312. A mouse 320, a keyboard 322, and an eye tracking device 324 are also in signal communication with the system bus 304 via the user interface adapter 314.

The server 300 also includes a communications adapter 328 in signal communication with the system bus 304, or via other suitable means as understood by those skilled in the art. The communications adapter 328 enables the exchange of data between the server 300 and a network, for example.

As will be recognized by those of ordinary skill in the pertinent art based on the teachings herein, alternate embodiments of the service provider computer server 300 are possible, such as, for example, embodying some or all of the computer program code in registers located on the processor chip 302. Given the teachings of the disclosure provided herein, those of ordinary skill in the pertinent art will contemplate various alternate configurations and implementations of elements of the server 300 while practicing within the scope and spirit of the present disclosure.

Figure 4:
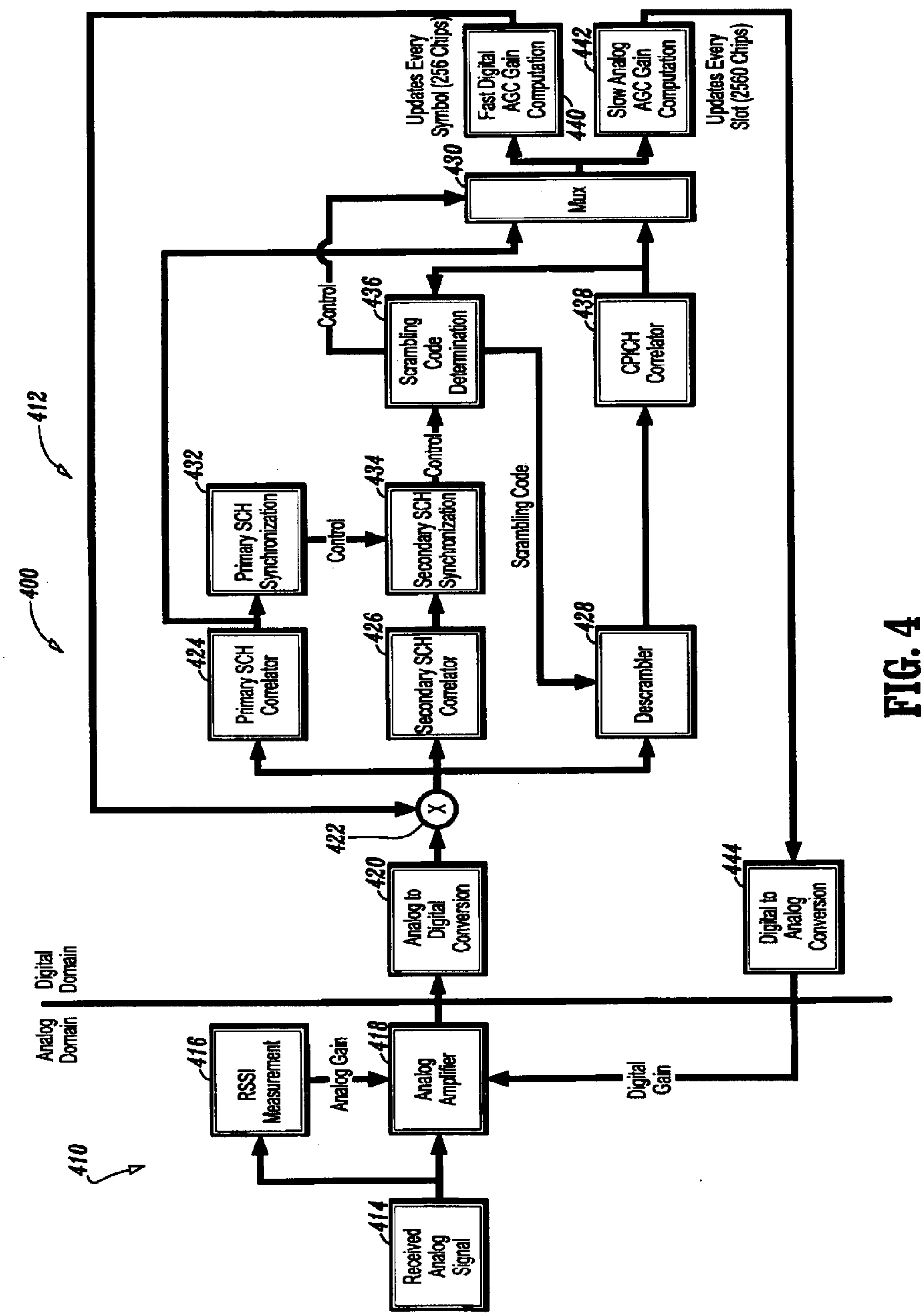
FIG. 4 shows a block diagram for a multi-stage automatic gain control usable in the apparatus of FIG. 2 for wideband code division multiple access embodiments of the system of FIG. 1.

As shown in FIG. 4, a block diagram for a multi-stage Automatic Gain Control ("AGC") is indicated generally by the reference numeral 400. The AGC 400 is usable in the hand-held apparatus 200 of FIG. 2 for Wideband Code Division Multiple Access ("WCDMA") embodiments of the system 100 of FIG. 1.

The AGC 400 includes an analog portion 410 and a digital portion 412. The analog portion 410 includes an analog receiver 414 in signal communication with a Received Signal Strength Indicator ("RSSI") 416 and an analog amplifier 418. The RSSI 416 is in signal communication with the amplifier 418 to provide a signal indicative of analog gain to the amplifier. The amplifier 418 is in signal communication with an Analog-to-Digital Converter ("A/D") 420, which, in turn, is in signal communication with a multiplier 422. The multiplier 422 is in signal communication with each of a primary Synchronization Channel ("SCH") correlator 424, a secondary SCH correlator 426 and a descrambler 428.

The primary SCH correlator 424 is in signal communication with each of a Multiplexer ("MUX") 430 and a primary SCH synchronizer 432. The primary SCH synchronizer 432 is in controllable signal communication with a secondary SCH synchronizer 434. The secondary SCH correlator is also in signal communication with the secondary SCH synchronizer 434. The secondary SCH synchronizer 434 is in controllable signal communication with a scrambling code determinator 436. The code determinator 436 is in signal communication with each of the descrambler 428 and the MUX 430. The descrambler 428 is in signal communication with a Common Pilot Channel ("CPICH") correlator 438, which, in turn, is in signal communication with each of the MUX 430 and the determinator 436.

The MUX 430 is in signal communication with each of a fast digital AGC gain, which updates for every symbol (256 chips), and a slow analog AGC gain, which updates for every slot (2560 chips or 10 symbols). The fast gain 440 is in signal communication with the multiplier 422. The slow gain 442 in signal communication with a Digital-to-Analog Converter ("D/A") 444, which, in turn, is in signal communication with the analog amplifier 418.

Figure 5:
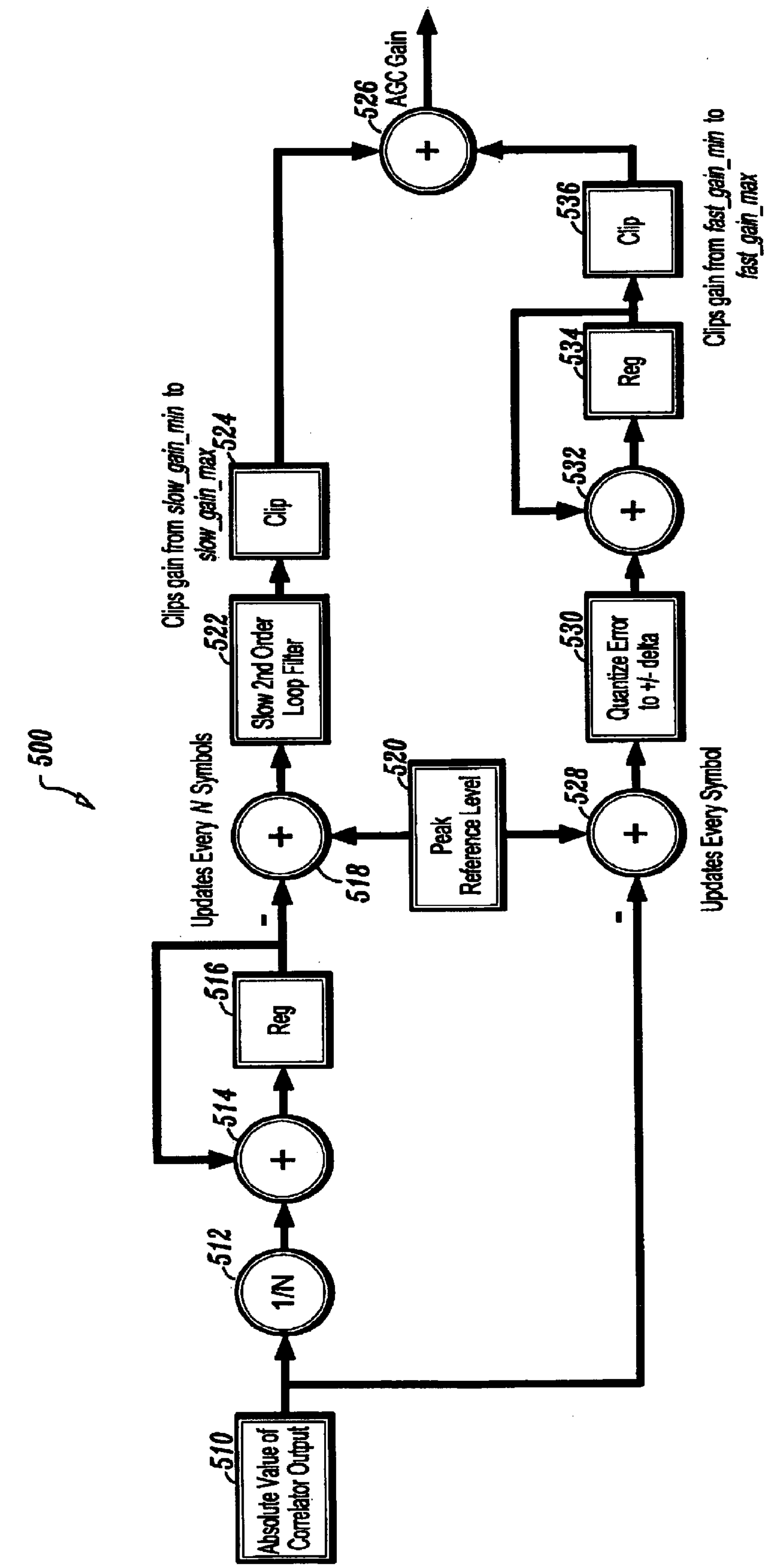
FIG. 5 shows a block diagram for the automatic gain control computation blocks of FIG. 4.

Turning to FIG. 5, an automatic gain control computation unit, such as that of the fast gain 440 and/or the slow gain 442 of FIG. 4, is indicated generally by the reference numeral 500. The computation unit 500 includes an absolute value function 510 for taking the absolute value of the output of the CPICH correlator 438 or the Primary SCH correlator 424 of FIG. 4. The absolute value function 510 is in signal communication with a 1/N inverter 512, which, in turn, is in signal communication with a positive input of a summer 514. The output of the summer 514 is in signal communication with a register 516, which feeds back to another positive input of the summer 514.

The output of the register 516 is also in signal communication with a negative input of a summer 518, which updates every N symbols. A peak reference level unit 520 is in signal communication with a positive input of the summer 518. The output of the summer is in signal communication with a slow second order loop filter 522. The slow second order loop filter 522 is in signal communication with a clipper 524 for clipping gains outside of a chosen range, such as, for example, from slow_gain_min to slow_gain_max. The clipper 524, in turn, is in signal communication with a positive input of a summer 526.

The absolute value function 510 is also in signal communication with a negative input of a summer 528, which updates every symbol. The peak reference level unit 520 is also in signal communication with the summer 528. The output of the summer 528 is in signal communication with an error quantizer 530, for quantizing the error to plus or minus delta. The quantizer 530, in turn, is in signal communication with a summer 532. The output of the summer 532 is coupled in signal communication to a register 534, which, in turn, is coupled to a clipper 536. The clipper 536 restricts the gain to a selected range, such as, for example, from fast_gain_min to fast_gain_max. The clipper 526 is in signal communication with another positive input of the summer 526, which, in turn, provides a signal indicative of the AGC gain.

As will be recognized by those of ordinary skill in the pertinent art, the error computation architecture described above is exemplary, and other types of error computation architectures can also be used with the overall AGC architecture presented in this disclosure. For example, a leaky integrator, as known in the art, can be used for the fast gain computation wherein the integrator slowly leaks out the value of that gain and returns it to some known value, such as 1, for example. This helps keep the fast gain centered instead of staying at some large positive or negative value. As the gain leaks away, the slow loop gain will change to compensate.

Figure 6:
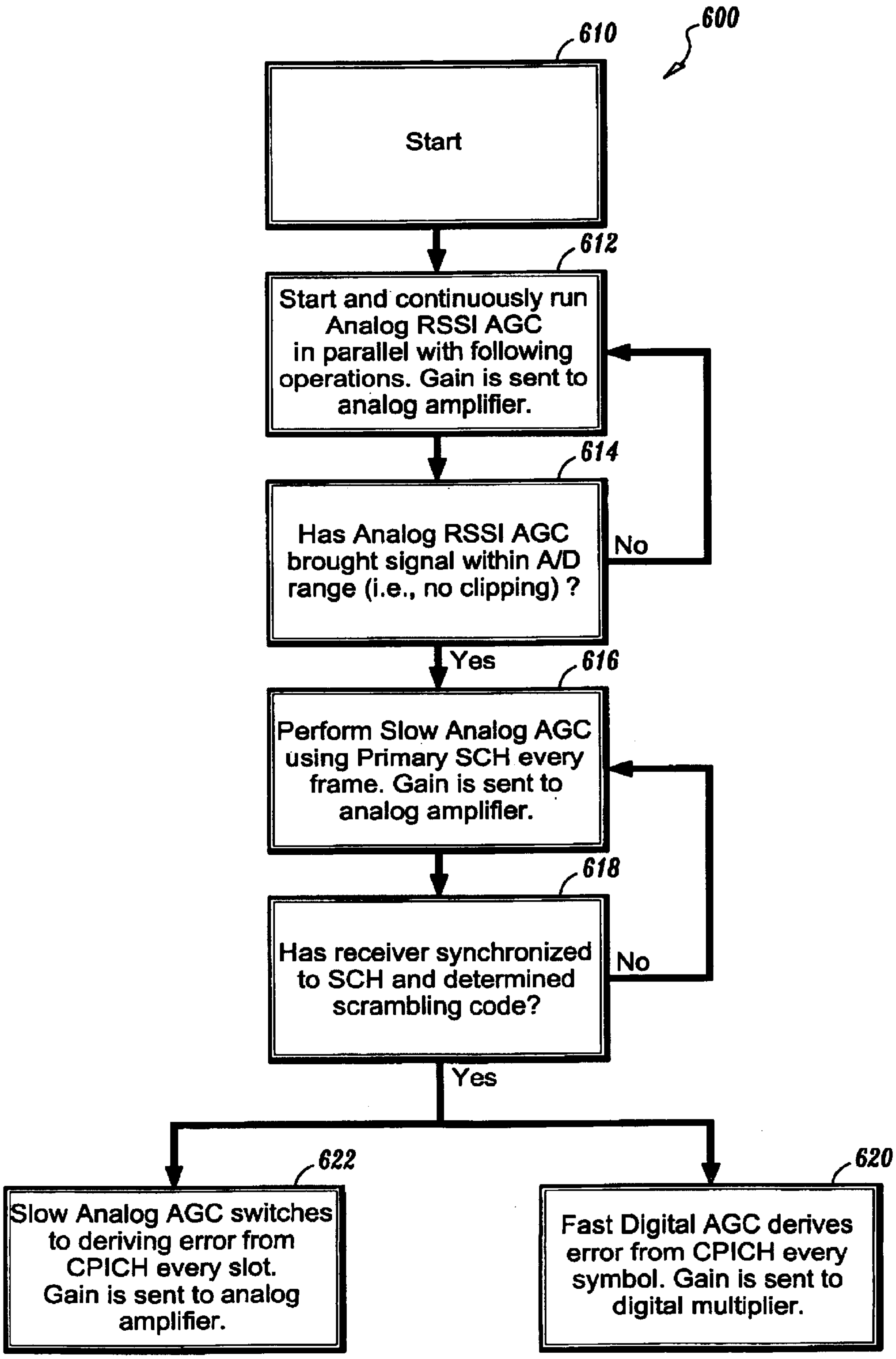
FIG. 6 shows a flow diagram for an automatic gain control strategy usable in accordance with the block diagrams of FIGS. 4 and 5 for wideband code division multiple access embodiments of the system of FIG. 1.

Turning now to FIG. 6, a flow diagram, indicated generally by the reference numeral 600, is shown for an automatic gain control ("AGC") strategy for wideband code division multiple access ("WCDMA") embodiments of the system of FIG. 1. A start block 610 transfers control to a run function block 612, which continuously runs an analog received signal strength indicator ("RSSI") AGC in parallel with the following operations, while the gain is sent to an analog amplifier. The block 612 passes control to a decision block 614, which determines whether the analog RSSI AGC has brought the signal within the range of the A/D converter without clipping. If not, control is passed back to function block 612. Otherwise, if the unclipped signal is within the A/D range, control is passed to a function block 616 to perform a slow analog AGC using the primary SCH for every frame, while sending the gain to the analog amplifier.

The block 616 passes control to a decision block 618 to determine whether the receiver has synchronized to the SCH and found the scrambling code. If not, control is passed back to the function block 616. Otherwise, two parallel processes are initiated. The parallel process 620 is where the fast digital AGC derives an error from the CPICH for every symbol, while the gain is sent to the digital multiplier. The parallel process 622 is where the slow analog AGC switches to deriving an error from the CPICH for every slot, while this gain is sent to the analog amplifier.

As will be recognized by those of ordinary skill in the pertinent art, the teachings of this AGC strategy are not limited to applications compliant with the WCDMA standard, and can be applied to any spread-spectrum system. Thus, the AGC strategies for the generic and WCDMA spread-spectrum applications are summarized by the following steps.

An AGC strategy for spread-spectrum communications system embodiments is as follows:

The Analog RSSI AGC runs constantly during operation of the receiver. The error is derived from the analog RSSI block and the gain is sent to an analog amplifier.

The Slow Analog AGC derives its error from a pilot and updates occur once every slot (i.e., every $N_s$ symbols). The gain is sent to an analog amplifier.

The Fast Digital AGC will run simultaneously with the Slow Analog AGC. The Fast Digital AGC will also derive its error from the pilot and updates will occur every symbol (i.e., every $N_c$ chips, where $N_c$ is the spreading factor for the symbol). The gain from the Fast Digital AGC is sent to a digital multiplier to allow for faster gain updates.

An AGC strategy optimized for WCDMA embodiments is as follows:

The Analog RSSI AGC runs constantly during operation of the receiver. The error is derived from the analog RSSI block and the gain is sent to an analog amplifier.

The Slow Analog AGC initially derives the error by averaging the signal over each frame of 15 slots, and computing an error once each frame. The gain from the Slow Analog AGC block is sent to an analog amplifier.

Simultaneously, the receiver synchronizes to the SCH channel, and determines timing synchronization as well as the scrambling code that is used in the current cell.

Once the scrambling code is determined, the CPICH pilot channel is descrambled.

The Slow Analog AGC switches to deriving its error from the CPICH and, now, updates occur once every slot or 2560 chips. The gain is still sent to an analog amplifier.

The Fast Digital AGC will turn on after the CPICH is decoded and it will run simultaneously with the Slow Analog AGC. The Fast Digital AGC will also derive its error from the CPICH, and updates will occur every symbol or 256 chips. The gain from the Fast Digital AGC is sent to a digital multiplier to allow for faster gain updates.

Figure 7:
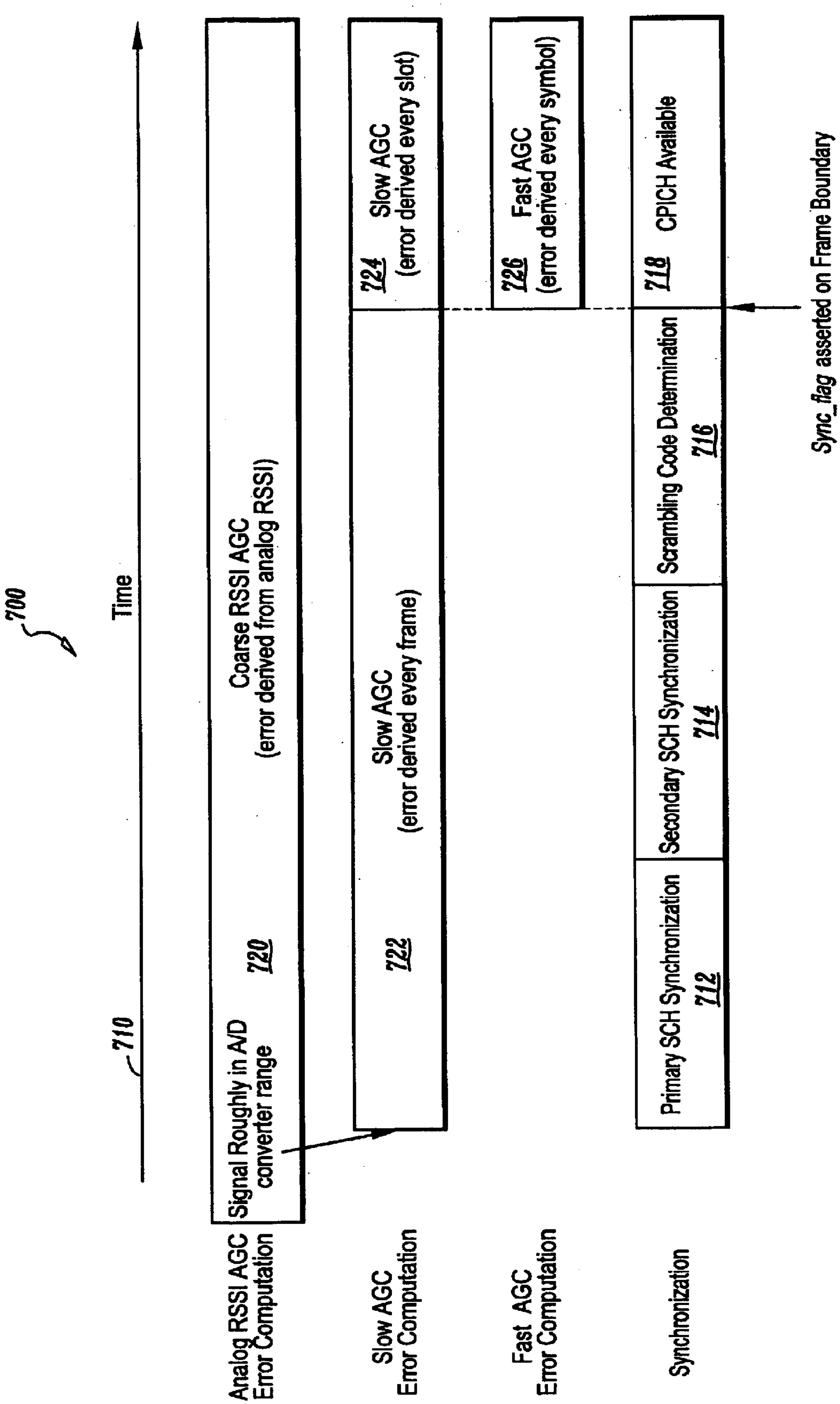
FIG. 7 shows a timing diagram for an automatic gain control strategy as set forth in FIG. 6.

As shown in FIG. 7, a timing diagram for an AGC strategy for WCDMA embodiments, as set forth in FIG. 6, is indicated generally by the reference numeral 700. A time line 710 runs from left to right at the top of the diagram 700. The synchronization activity includes a primary SCH synchronization 712, followed by a secondary SCH synchronization 714 and a scrambling code determination 716. A Sync_flag is asserted on a Frame Boundary after the scrambling code determination 716, and then the CPICH becomes available. The analog RSSI AGC error computation begins before the primary SCH synchronization 712. Here, the coarse RSSI AGC 720 derives the error from the analog RSSI. Once the signal is roughly in the range of the A/D converter, the slow AGC 722 derives the error every frame until the Sync_flag is asserted, and thereafter a slow AGC 724 is derived for every slot. The Fast AGC error computation 726 does not begin until the assertion of the Sync_flag, but thereafter is derived for every symbol.

Figure 8:
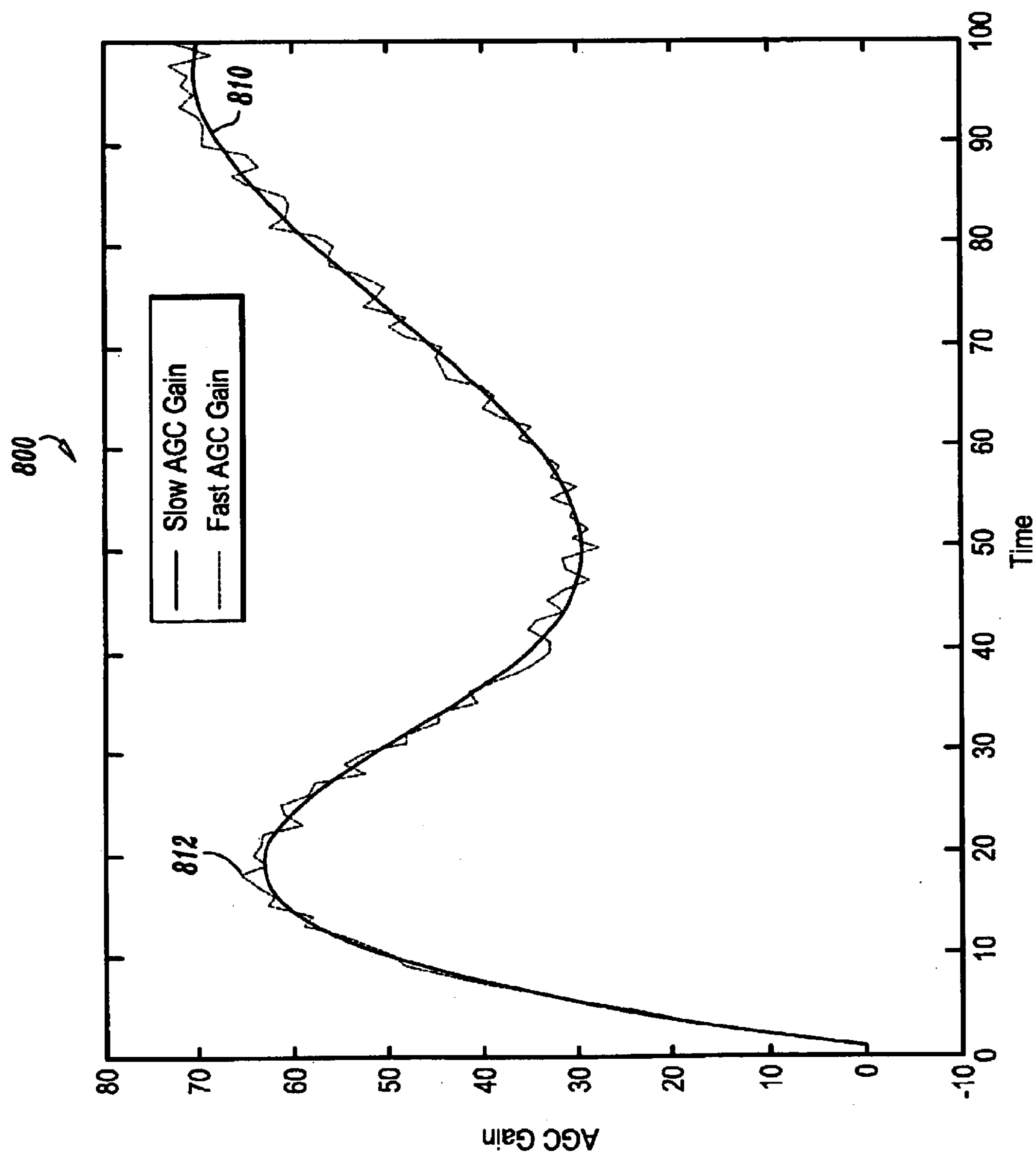
FIG. 8 shows a plot of automatic gain control versus time for a slow gain loop and for a fast gain loop combined with a slow gain loop in accordance with FIG. 6.

Turning to FIG. 8, a graph of automatic gain control gain versus time is indicated generally by the reference numeral 800. A plot 810 indicates a slow gain loop, and a fast gain loop combined with the slow gain loop is indicated by the plot 812. Thus, this exemplary graph 800 shows how a slow AGC tracks slow changes with a large dynamic range, while a fast AGC tracks quickly over a smaller dynamic range. Embodiments of the present disclosure integrate the slow AGC with the fast AGC, as shown by the plot 812, with improved performance.

In operation, an analog Received Signal Strength Indicator ("RSSI") AGC is used to operate entirely in the analog domain. The error is derived by comparing the power from the RSSI block to a known reference level. Because of the nature of the spread-spectrum signal, this only scales the entire received signal, including the desired signal plus the interfering signals plus the noise, so that this conglomerate signal will be within the range of the A/D converter. The analog RSSI AGC does not bring the desired signal to a known reference level, but merely adjusts the overall received signal to a reference level so that the signal isn't clipped or distorted at the A/D converter. This analog RSSI AGC runs continuously.

In a WCDMA system, the only signal that the receiver can initially tune to is the primary Synchronization Channel ("SCH"). It is the only signal whose spreading code is known throughout the entire system by all mobile handsets. The receiver synchronizes itself to the Primary SCH in order to determine chip, symbol and slot synchronization. While this process is occurring, the Slow Analog AGC will run. This slow loop will derive its error from the output of a correlator that correlates the received signal against the Primary SCH. In order to get a strong reference signal, and because the receiver is not yet fully synchronized to the Primary SCH, the Slow Analog AGC averages the Primary SCH correlator's output over 15 slots or one frame, and finds the height of the peak. An error is derived that is the difference between this peak and the ideal peak height. The Primary SCH includes only 256 non-zero chips out of each 2560 chips for the Universal Mobile Telecommunications System ("UMTS") WCDMA standard, for example, where one slot is 2560 chips. Thus, it is a sparse signal that cannot be used continuously, but it is all that the receiver has to work with at this stage of processing. The processor looks at data from an entire frame because there is no timing information yet so peak locations are not known, and because a slot contains only a single symbol that is not enough to average out the noise. The gain derived by the Slow Analog AGC loop is sent to an analog amplifier.

This Slow Analog AGC process continues to run, and once the receiver synchronizes to the Primary SCH, it will synchronize to the Secondary SCH to obtain frame synchronization and to determine the scrambling code used by the current cell. Once it determines the scrambling code, it will then descramble the CPICH pilot signal, which is scrambled differently for each cell. Unlike the Primary SCH that is only on for the first 256 chips of each slot, the CPICH is always on and can be used to continuously derive an error.

The CPICH pilot is used to drive two AGC loops. The Slow Analog AGC loop will switch from deriving its error from the Primary SCH to deriving its error by averaging the CPICH over an entire slot or 2560 chips. The gain that is computed will have a large dynamic range, but it is a slowly adapting loop. This loop is used to slowly track the average power of the desired signal. The gain from this loop continues to be sent to an analog amplifier.

The second loop is a Fast Digital AGC loop, and it also derives its error from the CPICH. However, in order to allow it to track faster changes, it computes its error on every symbol or 256 chips. This allows it to make quicker updates. The dynamic range of the gain is smaller than for the Slow Analog loop, and instead of running the error through a loop filter, each update to the Fast Digital AGC gain is quantized to either $+\Delta$ or $-\Delta$, depending on the sign of the error in this preferred embodiment. Alternate embodiments are possible, such as, for example, one that runs the error through a typical second-order loop filter. Thus, in this preferred embodiment, the Fast Digital AGC Gain will either increase or decrease by $\Delta$ for every symbol. This gain is sent to a digital multiplier, which allows for fast updates since the loop is digital. This loop is used to track sudden variations in the strength of the received signal.

Thus, the present disclosure teaches multi-stage and multi-loop Automatic Gain Control ("AGC") strategies and architectures for spread-spectrum communications receivers, including those that are compliant with the Wideband Code Division Multiple Access ("WCDMA") standard. It shall be understood by those of ordinary skill in the pertinent art that embodiments of the present disclosure can be used in any spread-spectrum system. In particular, embodiments are contemplated for use in a 3G cellular receiver that is compliant with the WCDMA and Code Division Multiple Access "cdma2000" standards.

These and other features and advantages of the present disclosure may be readily ascertained by one of ordinary skill in the pertinent art based on the teachings herein. It is to be understood that the teachings of the present disclosure may be implemented in various forms of hardware, software, firmware, special purpose processors, or combinations thereof.

The teachings of the present disclosure may be implemented as a combination of hardware and software. Moreover, the software is preferably implemented as an application program tangibly embodied on a program storage unit. The application program may be uploaded to, and executed by, a machine comprising any suitable architecture. Preferably, the machine is implemented on a computer platform having hardware such as one or more Central Processing Units ("CPUs"), a Random Access Memory ("RAM"), and Input/Output ("I/O") interfaces. The computer platform may also include an operating system and microinstruction code. The various processes and functions described herein may be either part of the microinstruction code or part of the application program, or any combination thereof, which may be executed by a CPU. In addition, various other peripheral units may be connected to the computer platform such as an additional data storage unit and an output unit.

It is to be further understood that, because some of the constituent system components and steps depicted in the accompanying drawings may be implemented in software, the actual connections between the system components or the process function blocks may differ depending upon the manner in which the present disclosure is programmed. Given the teachings herein, one of ordinary skill in the pertinent art will be able to contemplate these and similar implementations or configurations of the present disclosure.

As will be recognized by those of ordinary skill in the pertinent art based on the teachings herein, alternate embodiments are possible. Given the teachings of the disclosure provided herein, those of ordinary skill in the pertinent art will contemplate various alternate configurations and implementations of the system while practicing within the scope and spirit of the present disclosure.

Although the illustrative embodiments have been described herein with reference to the accompanying drawings, it is to be understood that the present disclosure is not limited to those precise embodiments, and that various changes and modifications may be effected therein by one of ordinary skill in the pertinent art without departing from the scope or spirit of the present disclosure. All such changes and modifications are intended to be included within the scope of the present disclosure as set forth in the appended claims.

What is claimed is:

1. A method for controlling the gain of a spread-spectrum receiver, the method comprising:

receiving an analog signal;

measuring the strength of the received analog signal;

deriving a first analog gain in correspondence with the measured strength;

applying the derived first analog gain to an analog amplifier;

deriving a second analog gain from a pilot channel signal within an automatic gain control loop;

deriving a digital gain from the pilot channel signal within the automatic gain control loop; and applying an automatic gain control signal indicative of the second analog gain and the digital gain to the analog amplifier.

2. A method as defined in claim 1 wherein the digital gain is derived simultaneously with the second analog gain.

3. A method as defined in claim 1 wherein the digital gain is derived more frequently than the second analog gain.

4. A method as defined in claim 1 wherein the second analog gain is derived once per slot.

5. A method as defined in claim 1 wherein the digital gain is derived once per symbol.

6. A method as defined in claim 1, further comprising digitally multiplying the digital gain for faster updates.

7. A method as defined in claim 1, further comprising:

initially deriving the second analog gain by averaging the pilot channel signal over each frame, and recomputing the gain once per frame;

simultaneously synchronizing the receiver to a synchronization channel and determining timing synchronization and a scrambling code for a current cell;

descrambling the pilot channel; and switching the derivation of the second analog gain from averaging to deriving its error from the pilot channel and updating once per slot.

8. A method as defined in claim 7 wherein each frame comprises fifteen slots.

9. A method as defined in claim 1 wherein deriving the first analog gain comprises scaling the entire received signal to be within the dynamic range of an analog-to-digital converter by using an analog signal indicative of received signal strength.

10. A method as defined in claim 1 wherein deriving the second analog gain comprises deriving an error signal every frame using a primary synchronization channel.

11. A method as defined in claim 1 wherein at least one of the second analog gain and the digital gain is derived after the receiver is synchronized to a synchronization channel.

12. A method as defined in claim 11, further comprising:

simultaneously updating the second analog gain every slot and the digital gain every symbol in accordance with an error derived from a common pilot channel.

13. A method as defined in claim 1 wherein the second analog gain corresponds to a wide dynamic range but tracks relatively slowly, and the digital gain corresponds to a smaller dynamic range but tracks relatively quickly.

14. A method as defined in claim 1 wherein the first analog gain is updated repeatedly during operation of the receiver.

15. A method as defined in claim 1 wherein the second analog gain is initially derived by averaging the signal over each frame of 15 slots and computing the gain once per frame.

16. A method as defined in claim 1 further comprising:

synchronizing the receiver to a synchronization channel; and determining timing synchronization and a scrambling code that is used in a current cell.

17. A method as defined in claim 16, further comprising descrambling a common pilot channel signal in accordance with the scrambling code.

18. A method as defined in claim 17, further comprising switching to deriving the second analog gain once per slot from the common pilot channel signal.

19. A method as defined in claim 18, further comprising deriving the digital gain once per symbol from the common pilot channel signal.

20. An automatic gain control apparatus (400) for a spread-spectrum receiver, the apparatus comprising:

a received signal strength indicator;

an analog amplifier in signal communication with the received signal strength indicator;

an analog-to-digital converter in signal communication with the analog amplifier;

a digital automatic gain control loop in signal communication with the analog-to-digital converter, the digital automatic gain control loop including a fast digital automatic gain control unit and a slow analog automatic gain control unit; and a digital-to-analog converter in signal communication with the digital automatic gain control loop for providing a signal indicative of a digital gain to the analog amplifier.

21. An apparatus as defined in claim 20 wherein at least one of the fast digital automatic gain control unit (440) and the slow analog automatic gain control unit comprises:

a peak reference level unit;

a filter in signal communication with the peak reference level unit;

a first clipper in signal communication with the filter;

a quantizer in signal communication with the peak reference level unit;

a feedback summing junction in signal communication with the quantizer;

a second clipper in signal communication with the feedback summing junction; and an automatic gain control summing junction in signal communication with each of the first clipper and the second clipper.

22. A program storage device readable by machine, tangibly embodying a program of instructions executable by the machine to perform method steps for controlling the gain of a spread-spectrum receiver, the method steps comprising:

receiving an analog signal;

measuring the strength of the received analog signal;

deriving a first analog gain in correspondence with the measured strength;

applying the derived first analog gain to an analog amplifier;

deriving a second analog gain from a pilot channel signal within an automatic gain control loop;

deriving a digital gain from the pilot channel signal within the automatic gain control loop; and applying an automatic gain control signal indicative of the second analog gain and the digital gain to the analog amplifier.

23. A program storage device as defined in claim 22, the method steps further comprising digitally multiplying the digital gain for faster updates.

24. A program storage device as defined in claim 22, the method steps further comprising:

deriving the second analog gain by averaging the pilot channel signal over each frame and recomputing the gain once per frame;

simultaneously synchronizing the receiver to a synchronization channel and determining timing synchronization and a scrambling code for a current cell;

descrambling the pilot channel; and switching the derivation of the second analog gain from averaging to deriving its error from the pilot channel and updating once per slot.

25. A program storage device as defined in claim 24, the method steps further comprising simultaneously updating the second analog gain every slot and the digital gain every symbol in accordance with an error derived from a common pilot channel.

26. A system for controlling the gain of a spread-spectrum receiver, the system comprising:

receiver means for receiving an analog signal;

measurement means for measuring the strength of the received analog signal;

first analog derivation means for deriving a first analog gain in correspondence with the measured strength;

first analog application means for applying the derived first analog gain to an analog amplifier;

second analog derivation means for deriving a second analog gain from a pilot channel signal within an automatic gain control loop;

digital derivation means for deriving a digital gain from the pilot channel signal within the automatic gain control loop; and automatic gain control application means for applying an automatic gain control signal indicative of the second analog gain and the digital gain to the analog amplifier.

27. A system as defined in claim 26, further comprising digital multiplication means for digitally multiplying the digital gain for faster updates.

28. A system as defined in claim 26, further comprising:

second analog derivation means for deriving the second analog gain by averaging the pilot channel signal over each frame and recomputing the gain once per frame;

synchronization means for simultaneously synchronizing the receiver to a synchronization channel and determining timing synchronization and a scrambling code for a current cell;

descrambler means for descrambling the pilot channel; and switch means for switching the derivation of the second analog gain from averaging to deriving its error from the pilot channel and updating once per slot.

29. A system as defined in claim 28, further comprising update means for simultaneously updating the second analog gain every slot and updating the digital gain every symbol in accordance with an error derived from a common pilot channel.

* * * * *